(12) United States Patent
Sakai et al.

(10) Patent No.: US 10,608,165 B2
(45) Date of Patent: Mar. 31, 2020

(54) PIEZOELECTRIC ELEMENT AND LIQUID EJECTING HEAD

(71) Applicant: Seiko Epson Corporation, Tokyo (JP)

(72) Inventors: Tomohiro Sakai, Matsumoto (JP); Koichi Morozumi, Shiojiri (JP); Kazuya Kitada, Suwa (JP); Harunobu Koike, Matsumoto (JP); Koji Sumi, Shiojiri (JP)

(73) Assignee: Seiko Epson Corportion (JP)

( * ) Notice: Subject to any disclaimer, the term of this patent is extended or adjusted under 35 U.S.C. 154(b) by 0 days.

(21) Appl. No.: 16/223,392

(22) Filed: Dec. 18, 2018

(65) Prior Publication Data
US 2019/0198750 A1 Jun. 27, 2019

(30) Foreign Application Priority Data
Dec. 21, 2017 (JP) ................. 2017-244921

(51) Int. Cl.
*H01L 41/187* (2006.01)
*B41J 2/14* (2006.01)
(Continued)

(52) U.S. Cl.
CPC ...... *H01L 41/1873* (2013.01); *B41J 2/14233* (2013.01); *H01L 41/0805* (2013.01);
(Continued)

(58) Field of Classification Search
CPC ................ B41J 2/14233; B41J 2202/03; B41J 2002/14241; H01L 41/1873; H01L 41/318; H01L 41/0973; H01L 41/0805
See application file for complete search history.

(56) References Cited

U.S. PATENT DOCUMENTS 6,328,433 B1 * 12/2001 Moriya .................... B41J 2/161
347/68
9,685,602 B2 * 6/2017 Sakuma ................. G11B 5/483
(Continued)

FOREIGN PATENT DOCUMENTS

EP   0 932 210 A2   7/1999
EP   3 048 652 A1   7/2016
(Continued)

OTHER PUBLICATIONS

Extended European Search Report for Application No. EP 18 21 4082 dated Jun. 24, 2019 (9 pages).
(Continued)

*Primary Examiner* — Geoffrey S Mruk
(74) *Attorney, Agent, or Firm* — Harness, Dickey & Pierce, P.L.C.

(57) ABSTRACT

Provided is a piezoelectric element including a first electrode provided above a substrate, a piezoelectric layer provided above the first electrode, containing potassium, sodium, and niobium, and having a perovskite structure, and a second electrode provided above the piezoelectric layer. In a case where the piezoelectric layer is divided into two portions at a center thereof in a thickness direction, the piezoelectric layer includes a first portion on the first electrode side and a second portion on the second electrode side. The piezoelectric layer includes line defects. A density of the line defects in the second portion is higher than a density of the line defects in the first portion.

9 Claims, 10 Drawing Sheets

(51) Int. Cl.
  *H01L 41/09* (2006.01)
  *H01L 41/318* (2013.01)
  *H01L 41/08* (2006.01)

(52) U.S. Cl.
  CPC ........ *H01L 41/0973* (2013.01); *H01L 41/318* (2013.01); *B41J 2002/14241* (2013.01); *B41J 2002/14362* (2013.01); *B41J 2002/14419* (2013.01); *B41J 2002/14491* (2013.01); *B41J 2202/03* (2013.01)

(56) References Cited

U.S. PATENT DOCUMENTS

2002/0149651 A1* 10/2002 Moriya .................... B41J 2/161
  347/68
2014/0084750 A1* 3/2014 Shimada ............. H01L 41/0973
  310/311
2016/0172574 A1 6/2016 Ikeuchi et al.

FOREIGN PATENT DOCUMENTS

JP 11-214762 A 8/1999
JP 2005-101472 A 4/2005

OTHER PUBLICATIONS

Yoichi Kizaki et al., "Defect Control for Low Leakage Current in $K_{0.5}Na_{0.5}NbO_3$ Single Crystals", Applied Physics Letters, American Institute of Physics Publishing LLC, vol. 89, No. 14, Oct. 4, 2006, pp. 142910-1-142910-3.

Fengping Lai et al., "Influence of Li Content on Electrical Properties of Highly Piezoelectric $(Li,K,Na)NbO_3$ Thin Films Prepared by Sol-Gel Processing", Journal of Applied Physics, American Institute of Physics, U.S., vol. 106, No. 6, Sep. 16, 2009, pp. 064101-1-64101-7.

* cited by examiner

PIEZOELECTRIC ELEMENT AND LIQUID EJECTING HEAD

This application claims priority under 35 U.S.C. § 119 to Japanese Patent Application No. 2017-244921 filed on Dec. 21, 2017, the entire disclosure of which is expressly incorporated by reference herein.

BACKGROUND

1. Technical Field

The present invention relates to a piezoelectric element and a liquid ejecting head.

2. Related Art

A piezoelectric element typically includes a piezoelectric layer having an electromechanical conversion characteristic and two electrodes that sandwich the piezoelectric layer. Such a piezoelectric element is incorporated in, for example, a liquid ejecting head represented by an ink jet recording head.

For example, JP-A-11-214762 discloses a piezoelectric element that relieves inner stress in a production process by forming a layer (dislocation layer) having lattice defects in a piezoelectric film and thus prevents occurrence of cracks.

In the piezoelectric element described above, suppression of leak current is desired. Although a relationship between lattice defects and cracks is described in JP-A-11-214762, JP-A-11-214762 does not describe anything about a relationship between lattice defects and leak current. As a result of intensive studies, the present inventors have found that there is a correlation between the density, position in the thickness direction, and kind of lattice defects generated in the piezoelectric layer and leak current.

SUMMARY

One of advantages according to some aspects of the invention is to provide a piezoelectric element capable of suppressing leak current. In addition, one of advantages according to some aspects of the invention is to provide a liquid ejecting head including the piezoelectric element mentioned above.

The invention is made to solve at least part of the problems described above, and can be implemented as following embodiments.

A piezoelectric element according to an aspect of the invention includes a first electrode provided above a substrate, a piezoelectric layer provided above the first electrode, containing potassium, sodium, and niobium, and having a perovskite structure, and a second electrode provided above the piezoelectric layer. In a case where the piezoelectric layer is divided into two portions at a center thereof in a thickness direction, the piezoelectric layer includes a first portion on the first electrode side and a second portion on the second electrode side. The piezoelectric layer includes line defects. A density of the line defects in the second portion is higher than a density of the line defects in the first portion.

According to such a piezoelectric element, leak current can be suppressed as compared with a case where the density of line defects in the second portion is equal to or lower than the density of line defects in the first portion.

To be noted, in description related to the invention, a term "above" is used in such a manner that, for example, "forming a specific thing (hereinafter referred to as "B") "above" another specific thing (hereinafter referred to as "A")" refers to both of a case where B is formed directly on A and a case where B is formed above A with another matter interposed therebetween.

In the piezoelectric element according to the invention, the line defects may be observed in a case where lattice periodicity of the piezoelectric layer in a direction perpendicular to the thickness direction is observed.

In such a piezoelectric element, leak current can be more surely suppressed.

In the piezoelectric element according to the invention, the line defects may be edge dislocations.

In such a piezoelectric element, leak current can be more surely suppressed.

In the piezoelectric element according to the invention, the line defects may be positive edge dislocations.

In such a piezoelectric element, leak current can be more surely suppressed.

A liquid ejecting head according to an aspect of the invention includes the piezoelectric element according to the invention.

In such a liquid ejecting head, due to the piezoelectric element according to the invention, for example, a diaphragm can be more efficiently displaced.

BRIEF DESCRIPTION OF THE DRAWINGS

The invention will be described with reference to the accompanying drawings, wherein like numbers reference like elements.

DESCRIPTION OF EXEMPLARY EMBODIMENTS

A preferable embodiment of the invention will be described in detail with reference to drawings. To be noted, the embodiment that will be described later should not unreasonably limit the scope of the invention described in claims. In addition, not all elements that will be described below are always required for the invention.

1. PIEZOELECTRIC ELEMENT

First, a piezoelectric element according to the present embodiment will be described with reference to drawings.

Figure 1:
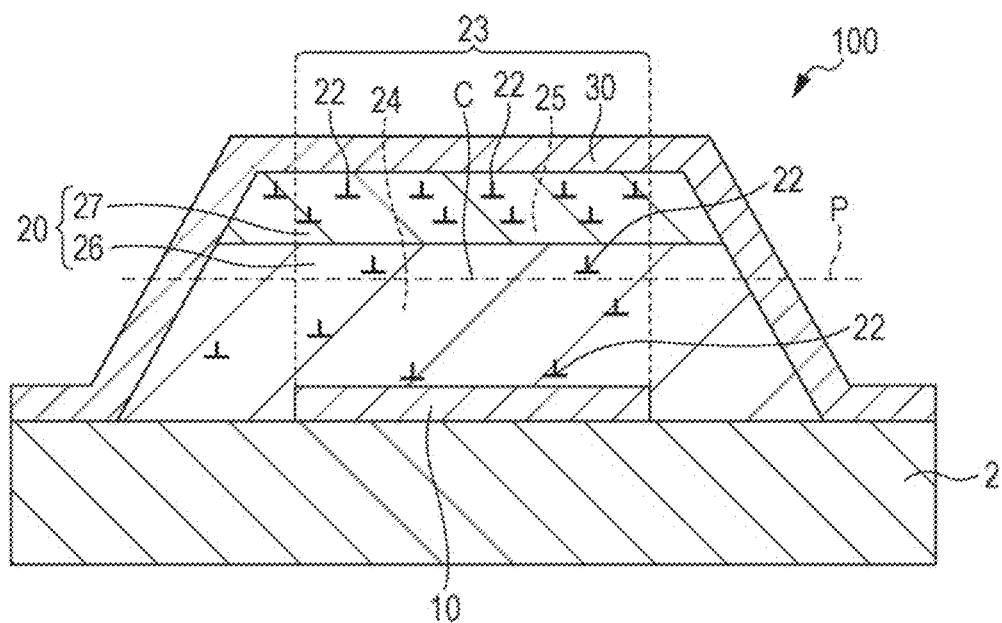
FIG. 1 is a schematic section view of a piezoelectric element according to an embodiment.

FIG. 1 is a schematic section view of a piezoelectric element 100 according to the present embodiment.

As illustrated in FIG. 1, the piezoelectric element 100 includes a first electrode 10, a piezoelectric layer 20, and a second electrode 30. The piezoelectric element 100 is formed on, for example, a substrate 2.

For example, the substrate 2 is a flat plate formed from semiconductor, insulator, or the like. The substrate 2 may be a single layer or have a structure in which a plurality of layers are laminated. The inner structure of the substrate 2 is not limited as long as the top surface thereof is flat. For example, the substrate 2 may have a structure in which a space or the like is provided therein.

The substrate 2 may include a diaphragm that is flexible and can be deformed (displaced) by a function of the piezoelectric layer 20. The diaphragm is, for example, a silicon oxide layer, a zirconium oxide layer, or a laminate of these (for example, a laminate in which a zirconium oxide layer is provided on a silicon oxide layer).

The first electrode 10 is provided above the substrate 2. In the illustrated example, the first electrode 10 is provided on the substrate 2. The shape of the first electrode 10 is, for example, a layer shape. The film thickness (thickness) of the first electrode 10 is, for example, 3 nm to 200 nm. Examples of the material of the first electrode 10 include metal layers such as an iridium layer and a platinum layer, layers of conductive oxides of these (for example, an iridium oxide layer), and a strontium ruthenate ($SrRuO_3$: SRO) layer. The first electrode 10 may have a structure in which a plurality of the layers exemplified above are laminated.

The first electrode 10 is one of two electrodes for applying a voltage to the piezoelectric layer 20. The first electrode 10 is a lower electrode provided below the piezoelectric layer 20.

Although not illustrated, a firm contact layer for improving the firmness of contact of the first electrode 10 and the substrate 2 may be provided between the first electrode 10 and the substrate 2. Examples of the firm contact layer include a titanium layer and a titanium oxide layer.

The piezoelectric layer 20 is provided above the first electrode 10. In the illustrated example, the piezoelectric layer 20 is provided on the first electrode 10. Further, the piezoelectric layer 20 is provided on the substrate 2 so as to cover the first electrode 10. The film thickness of the piezoelectric layer 20 is, for example, 100 nm to 3 μm. The piezoelectric layer 20 can be deformed by applying voltage between the first electrode 10 and the second electrode 30.

The piezoelectric layer 20 contains potassium (K), sodium (Na), and niobium (Nb), and has a perovskite structure. The piezoelectric layer 20 is, for example, a potassium sodium niobate (KNN) layer. The piezoelectric layer 20 may be a KNN layer to which manganese (Mn) is added.

The piezoelectric layer 20 includes line defects 22. That is, the line defects 22 are generated in the piezoelectric layer 20. For the sake of convenience, the line defects 22 are represented by "⊥" in FIG. 1. The vertical line indicates an extra half plane, and the horizontal line indicates a slip plane. The piezoelectric layer 20 includes a plurality of line defects 22. The number of the line defects 22 is not particularly limited.

Figure 2:
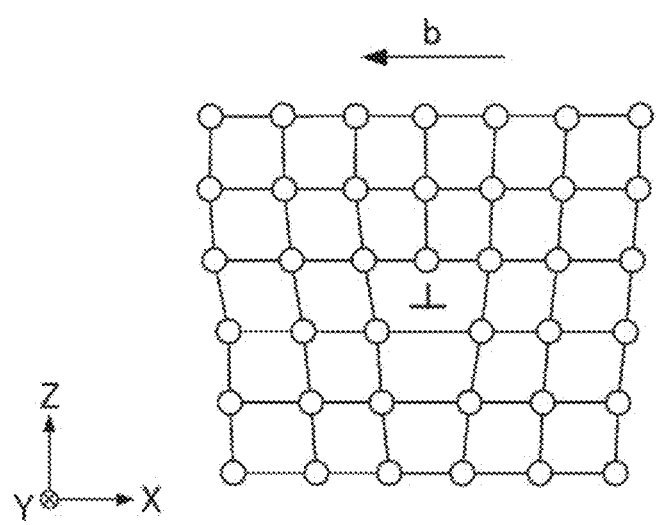
FIG. 2 is a diagram for describing positive edge dislocations.
Figure 3:
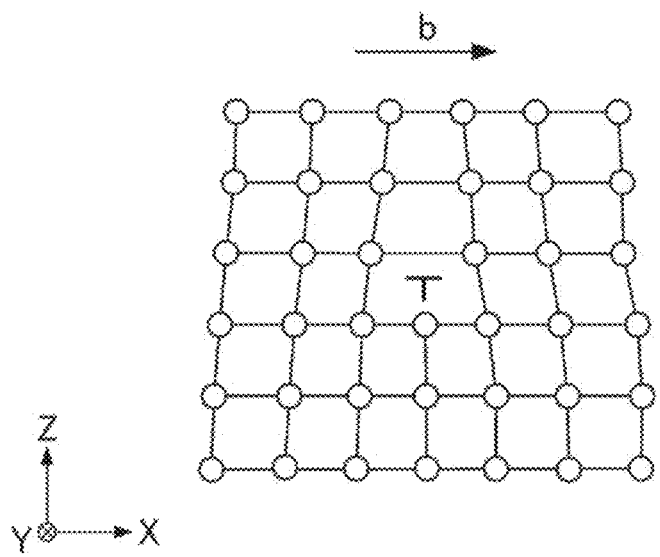
FIG. 3 is a diagram for describing negative edge dislocations.

The line defects 22 are lattice defects. Specifically, the line defects 22 are positive edge dislocations. A "positive edge dislocation" is a dislocation in which a Burgers vector b is perpendicular to the direction of the dislocation (Y axis direction illustrated in FIG. 2) and the Burgers vector b is in a −X direction as illustrated in FIG. 2. In contrast, a "negative edge dislocation" is a dislocation in which the Burgers vector b is perpendicular to the direction of the dislocation (Y axis direction illustrated in FIG. 3) and the Burgers vector b is in a +X direction as illustrated in FIG. 3.

To be noted, FIG. 2 is a diagram for describing positive edge dislocations, and an edge dislocation is represented by "⊥" (a sign in which a vertical line is disposed on a horizontal line) therein. In addition, FIG. 3 is a diagram for describing negative edge dislocations, and an edge dislocation is represented by a sign in which a vertical line is disposed under a horizontal line therein. In FIGS. 2 and 3, atoms are represented by white circles. In addition, in FIGS. 2 and 3, an X axis, a Y axis, and a Z axis are shown as three axes perpendicular to one another. In FIGS. 2 and 3, the Z axis direction is, for example, the thickness direction of the piezoelectric layer.

The line defects 22 are observed in the case where lattice periodicity of the piezoelectric layer 20 in a direction perpendicular to the thickness direction is observed. Specifically, the line defects 22 are observed by a transmission electron microscope (TEM) when crystal planes arranged in a direction (longitudinal direction, "in plane") perpendicular to the thickness direction of the piezoelectric layer 20 are observed (see "Experimental Examples" that will be described later for more specific observation direction of the line defects 22). In addition, whether or not the line defects 22 are edge dislocations, and in the case where the line defects 22 are edge dislocations, the kind of the edge dislocations (whether the edge dislocations are positive edge dislocations or negative edge dislocations) can be also observed by the TEM.

Here, the reason why the line defects 22 are generated in the piezoelectric layer 20 will be described. In a production method of the piezoelectric element 100, as will be described later, the second electrode 30 is formed by a sputtering method. When metal atoms (for example, platinum atoms, hereinafter also referred to as "second electrode atoms") that are to be the second electrode 30 reach the piezoelectric layer 20 during formation of the second electrode 30 by the sputtering method, while second electrode atoms having relatively low kinetic energy remain on the surface (top surface) of the piezoelectric layer 20, some second electrode atoms having high kinetic energy get into the piezoelectric layer 20. The second electrode atoms having got into the piezoelectric layer 20 break the perovskite structure of the piezoelectric layer 20. The part where the perovskite structure of the piezoelectric layer 20 has been broken turns amorphous. Since bonding in the part of the piezoelectric layer 20 having turned amorphous is unstable, when a voltage is applied to the piezoelectric layer 20 in this state, the part having turned amorphous is likely to conduct electrons and metal ions, and thus the leak current increases.

In the production method of the piezoelectric element 100, as will be described later, a heating process is performed after forming the second electrode 30. As a result of this heating process, most part of the broken perovskite structure (most of the part having turned amorphous) recrystallizes. At this time, the second electrode atoms are taken into the perovskite structure. However, since the part of the piezoelectric layer 20 containing the second electrode atoms is difficult to keep the perovskite structure with the same lattice constant as a part of the piezoelectric layer 20 not containing the second electrode atoms due to a relationship between the ionic radius and charge numbers of the second electrode atoms. Therefore, stress derived from the difference between the lattice constant of the part of the piezoelectric layer 20 containing the second electrode atoms and the lattice constant of the part of the piezoelectric layer 20 not containing the second electrode atoms is generated, and the line defects 22 are generated by the stress.

Generation of the line defects 22 relieves the stress derived from the difference in lattice constant, and thus the piezoelectric layer 20 becomes energetically stable. Thus, the leak current in the piezoelectric layer 20 is expected to be suppressed.

The piezoelectric layer 20 includes a portion 23 (electrode-sandwiched portion sandwiched by the first electrode 10 and the second electrode 30) positioned between the first electrode 10 and the second electrode 30. In the case where the piezoelectric layer 20 is divided into two portions at the center thereof in the thickness direction, the piezoelectric layer 20 includes a first portion 24 on the first electrode 10 side and a second portion 25 on the second electrode 30 side. The thickness direction of the piezoelectric layer 20 is, for example, a direction of a line perpendicular to the top surface of the substrate 2.

Here, "the case where the piezoelectric layer 20 is divided into two portions at the center thereof in the thickness direction" refers to a case where the piezoelectric layer 20 is divided into two portions at the center thereof in the thickness direction in the electrode-sandwiched portion 23 of the piezoelectric layer 20, and the first portion 24 and the second portion 25 are included in the electrode-sandwiched portion 23. In addition, "the case where the piezoelectric layer 20 is divided into two portions at the center thereof in the thickness direction" refers to, for example, a case where the piezoelectric layer 20 is divided into two portions at a virtual plane in the same distance from the first electrode 10 and the second electrode 30 in the electrode-sandwiched portion 23.

In the illustrated example, the electrode-sandwiched portion 23 includes the first portion 24 below a virtual plane P and the second portion 25 above the virtual plane P. The virtual plane P is a plane that passes through a center C of the electrode-sandwiched portion 23 and is perpendicular to the thickness direction of the piezoelectric layer 20 (has a perpendicular line extending in the thickness direction). In the illustrated example, the electrode-sandwiched portion 23 has a rectangular shape.

The density of the line defects 22 in the second portion 25 is higher than the density of the line defects 22 in the first portion 24. For example, a value (N2/V2) obtained by dividing the total number (N2) of the line defects 22 in the second portion 25 by the volume (V2) of the second portion 25 is larger than a value (N1/V1) obtained by dividing the total number (N1) of the line defects 22 in the first portion 24 by the volume (V1) of the first portion 24.

The piezoelectric layer 20 includes, for example, a first layer 26 and a second layer 27. The first layer 26 is provided on the first electrode 10 and the substrate 2. The second layer 27 is provided on the first layer 26.

The density of the line defects 22 is higher in the second layer 27 than in the first layer 26. For example, in the case of forming the piezoelectric layer 20 by laminating a plurality of precursor layers by a liquid phase method, the second layer 27 may be constituted by a precursor layer that has been formed last (in the uppermost position) and a precursor layer that has been formed second to last (in the second uppermost position). In the illustrated example, the second layer 27 is in contact with the second electrode 30 in the electrode-sandwiched portion 23. The film thickness of the second layer 27 is, for example, 50 nm to 200 nm. In the first layer 26, the line defects 22 may be uniformly arranged. Although not illustrated, the first layer 26 does not have to include the line defects 22.

In the illustrated example, the first portion 24 is constituted by the first layer 26, and the second portion 25 is constituted by the first layer 26 and the second layer 27. Therefore, the density of the line defects 22 in the second portion 25 is higher than the density of the line defects 22 in the first portion 24.

The magnitude relationship between the density of the line defects 22 in the first portion 24 and the density of the line defects 22 in the second portion 25 can be grasped by, for example, using a TEM. For example, an image (near-first electrode 10 image) of 200 nm×200 nm in which a region from the bottom surface (for example, interface between the first portion 24 and the first electrode 10) of the first portion 24 to 200 nm above the bottom surface can be observed is obtained. Further, an image (near-second electrode 30 image) of 200 nm×200 nm in which a region from the top surface (for example, interface between the second portion 25 and the second electrode 30) of the second portion 25 to 200 nm below the top surface can be observed is obtained. Then, the magnitude relationship between the density of the line defects 22 in the near-first electrode 10 image and the density of the line defects 22 in the near-second electrode 30 image can be grasped by comparing the number of the line defects 22 observed in the near-first electrode 10 image with the number of the line defects 22 observed in the near-second electrode 30 image. The magnitude relationship between the density of the line defects 22 in the near-first electrode 10 image and the density of the line defects 22 in the near-second electrode image can be regarded as the magnitude relationship between the density of the line defects 22 in the first portion 24 and the density of the line defects 22 in the second portion 25. As described above, the magnitude relationship between the density of the line defects 22 in the first portion 24 and the density of the line defects 22 in the second portion 25 can be grasped.

The second electrode 30 is provided above the piezoelectric layer 20. In the illustrated example, the second electrode 30 is provided on the piezoelectric layer 20. Further, the second electrode 30 is provided on the side surface of the piezoelectric layer 20 and on the substrate 2. As a result of the second electrode 30 being provided on the side surface of the piezoelectric layer 20, penetration of moisture into the piezoelectric layer 20 through the side surface of the piezoelectric layer 20 can be suppressed.

The shape of the second electrode 30 is, for example, a layer shape. The film thickness of the second electrode 30 is, for example, 50 nm to 300 nm. Examples of the second electrode 30 include metal layers such as an iridium layer and a platinum layer, layers of conductive oxides of these (for example, an iridium oxide layer), and a strontium ruthenate layer. The second electrode 30 may have a structure in which a plurality of the layers exemplified above are laminated.

The second electrode 30 is the other of the two electrodes for applying a voltage to the piezoelectric layer 20. The second electrode 30 is an upper electrode provided above the piezoelectric layer 20.

For example, the piezoelectric element 100 may be used for a liquid ejecting head or a printer including the liquid ejecting head as a piezoelectric actuator for pressurizing a liquid in a pressure generating chamber, or may be used for other applications such as a piezoelectric sensor (ultrasonic sensor or gyro sensor) that detects deformation of the piezoelectric layer as an electric signal.

The piezoelectric element 100 has, for example, the following features.

In the piezoelectric element 100, the density of the line defects 22 in the second portion 25 of the piezoelectric layer 20 is higher than the density of the line defects 22 in the first portion 24 of the piezoelectric layer 20. Therefore, in the piezoelectric element 100, the leak current (leak current that flows between the first electrode 10 and the second electrode 30 through the piezoelectric layer 20) can be suppressed as compared with a case where the density of the line defects 22 in the second portion 25 is equal to or lower than the density of the line defects 22 in the first portion 24 (see "Experimental Examples" that will be described later for details).

In the piezoelectric elements 100, the line defects 22 are observed in the case where lattice periodicity of the piezoelectric layer 20 in a direction perpendicular to the thickness direction is observed. Further, in the piezoelectric element 100, the line defects 22 are positive edge dislocations. Therefore, in the piezoelectric element 100, the leak current can be more surely suppressed (see "Experimental Examples" that will be described later for details).

To be noted, although an example in which the piezoelectric layer 20 is provided on the substrate 2 so as to cover the first electrode 10 and further the second electrode 30 is provided on the side surface of the piezoelectric layer 20 has been described above, in the piezoelectric element according to the invention, the piezoelectric layer 20 may be just provided above the first electrode 10 and the second electrode 30 may be just provided above the piezoelectric layer 20.

2. PRODUCTION METHOD OF PIEZOELECTRIC ELEMENT

Figure 4:
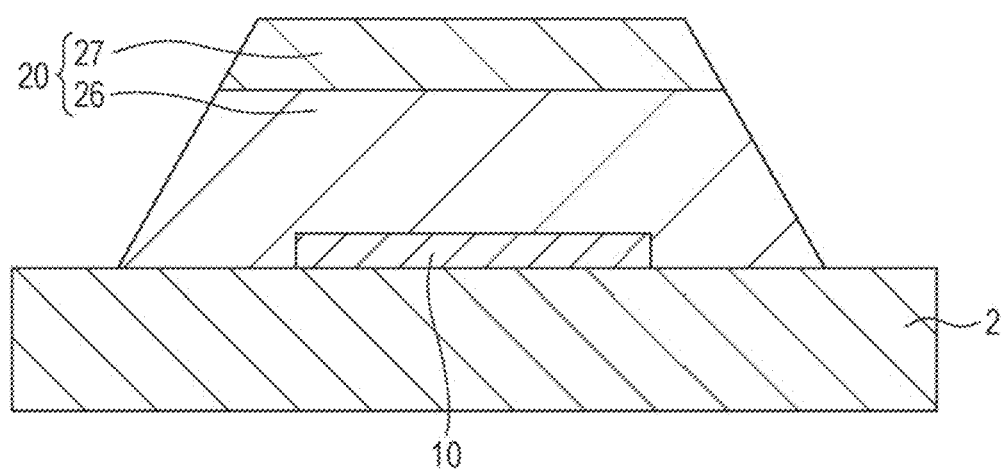
FIG. 4 is a schematic section view of the piezoelectric element according to the embodiment schematically illustrating a production process thereof.

Next, a production method of the piezoelectric element 100 according to the present embodiment will be described with reference to drawings. FIG. 4 is a schematic section view of the piezoelectric element 100 according to the present embodiment schematically illustrating a production process thereof.

As illustrated in FIG. 4, the substrate 2 is prepared. Specifically, a silicon oxide layer is formed by thermally oxidizing a silicon substrate. Next, a zirconium layer is formed on the silicon oxide layer by a sputtering method or the like, and a zirconium oxide layer is formed by oxidizing the zirconium layer. The substrate 2 can be prepared in accordance with the steps described above.

Next, the first electrode 10 is formed on the substrate 2. The first electrode 10 is formed by, for example, a sputtering method or a vacuum deposition method.

Next, the piezoelectric layer 20 is formed on the first electrode 10. The piezoelectric layer 20 is formed by, for example, a liquid phase method (chemical solution method) such as a sol-gel method or metal organic deposition (MOD). A formation method of the piezoelectric layer 20 will be described below.

A metal complex containing K, a metal complex containing Na, and a metal complex containing Nb are dissolved or dispersed in an organic solvent to prepare a precursor solution.

The prepared precursor solution is applied on the first electrode 10 by using a spin coating method to form a precursor layer (application step). Next, the precursor layer is heated to, for example, 130° C. to 250° C. and dried for a certain period (drying step). Further, the dried precursor layer is degreased by heating the precursor layer and keeping the precursor layer at, for example, 300° C. to 450° C. for a certain period (degreasing step). Next, the degreased precursor layer is crystallized by heating the precursor layer and keeping the precursor layer at, for example, 650° C. to 800° C. for a certain period (firing step).

Next, the precursor layer and the first electrode are patterned by, for example, photolithography and etching. As a result of this, the precursor layer and the first electrode 10 having predetermined shapes can be formed.

Next, the precursor solution that has been prepared is applied on the precursor layer and the substrate, and the series of steps from the application step to the firing step described above are performed. The piezoelectric layer 20 constituted by a plurality of precursor layers can be formed by repetitively performing this series of steps from the application step to the firing step. The number of precursor layers is not particularly limited, and, for example, the piezoelectric layer 20 may be constituted by six precursor layers. In this case, the first layer 26 of the piezoelectric layer 20 may be constituted by precursor layers that are formed in the first to fourth cycles of the repetition, and the second layer 27 of the piezoelectric layer 20 may be constituted by precursor layers that are formed in the fifth and sixth cycles of the repetition.

Examples of the metal complex containing K include potassium 2-ethylhexanoate and potassium acetate. Examples of the metal complex containing Na include sodium 2-ethylhexanoate and sodium acetate. Examples of the metal complex containing Nb include niobium 2-ethylhexanoate and niobium pentaethoxide. To be noted, two or more kinds of metal complexes may be used in combination. For example, potassium 2-ethylhexanoate and potassium acetate may be used together as the metal complex containing potassium.

Examples of the solvent include propanol, butanol, pentanol, hexanol, octanol, ethylene glycol, propylene glycol, octane, decane, cyclohexane, xylene, toluene, tetrahydrofuran, acetic acid, octylic acid, 2-n-butoxyethanol, n-octane, and mixture solvents of these.

Examples of a heating apparatus used in the drying step, the degreasing step, and the firing step for forming the precursor layer include a rapid thermal annealing (RTA) apparatus that performs heating by radiation of infrared light.

Next, the piezoelectric layer 20 is patterned by, for example, photolithography and etching. As a result of this, the piezoelectric layer 20 having a predetermined shape can be formed.

As illustrated in FIG. 1, the second electrode 30 is formed on the piezoelectric layer 20. The second electrode 30 is formed by film formation by a sputtering method and patterning by photolithography and etching. In the sputtering method for forming the second electrode 30, the second electrode atoms get into the piezoelectric layer 20. The second electrode atoms having got into the piezoelectric layer 20 break the perovskite structure of the piezoelectric layer 20. The part where the perovskite structure of the piezoelectric layer 20 has been broken turns amorphous.

Next, the substrate 2, the first electrode 10, the piezoelectric layer 20, and the second electrode 30 are subjected to the heating process. This heating process is performed by, for example, raising the temperature from 350° C. to 750° C. at a temperature raising rate of 4° C./sec by using the RTA apparatus and maintaining the temperature at 750° C. for 10 minutes. As a result of this heating process, most of the part of the piezoelectric layer 20 that has turned amorphous recrystallizes. At this time, the second electrode atoms are taken into the perovskite structure, and it becomes difficult to keep the perovskite structure with the same lattice constant as the part of the piezoelectric layer 20 not containing the second electrode atoms. Therefore, stress derived from the difference between the lattice constant of the part of the piezoelectric layer 20 containing the second electrode atoms and the lattice constant of the part of the piezoelectric layer 20 not containing the second electrode atoms is generated, and the line defects 22 are generated by the stress.

The piezoelectric element 100 can be prepared in accordance with the steps described above.

3. LIQUID EJECTING HEAD

Figure 5:
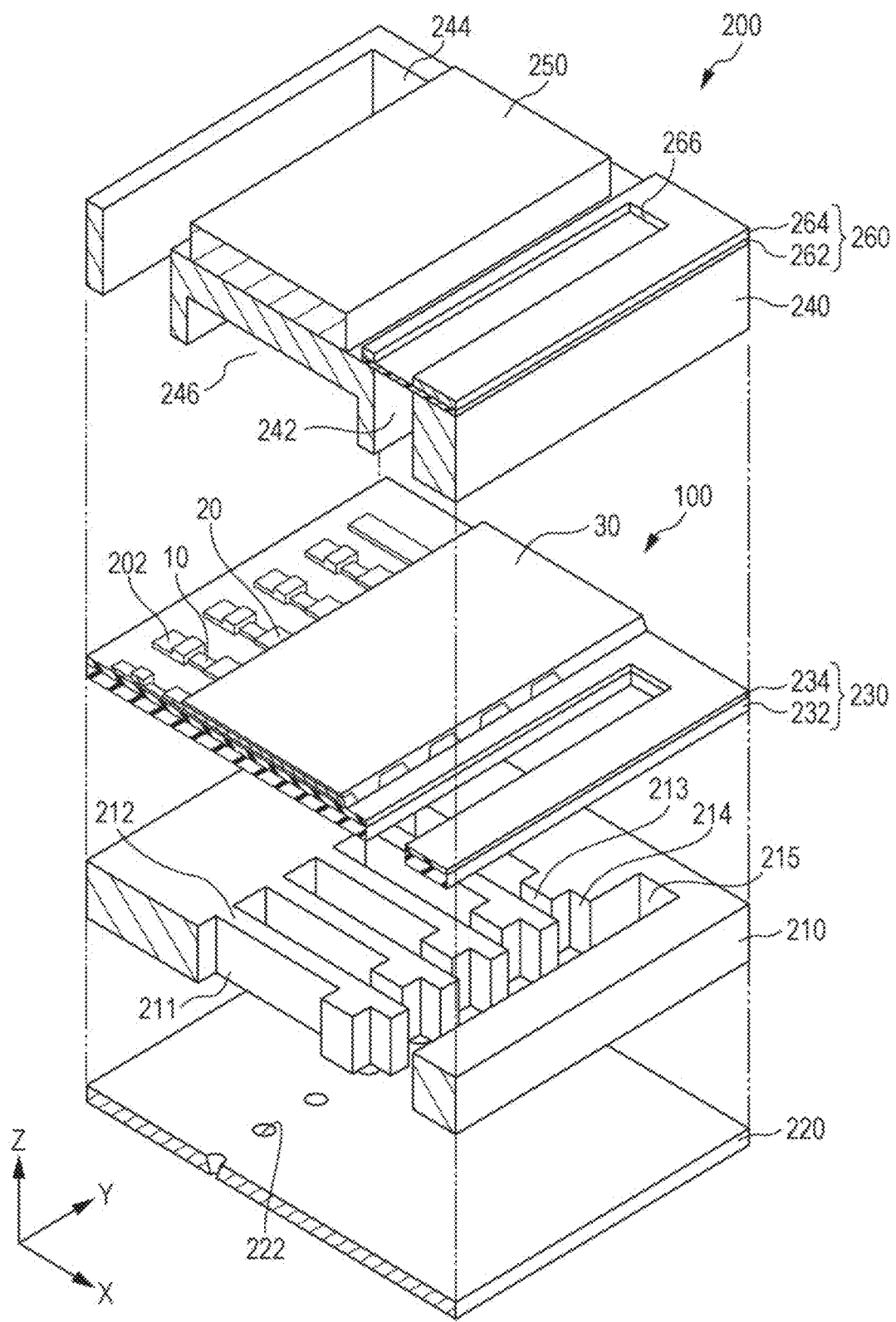
FIG. 5 is a schematic exploded perspective view of a liquid ejecting head according to the embodiment.
Figure 6:
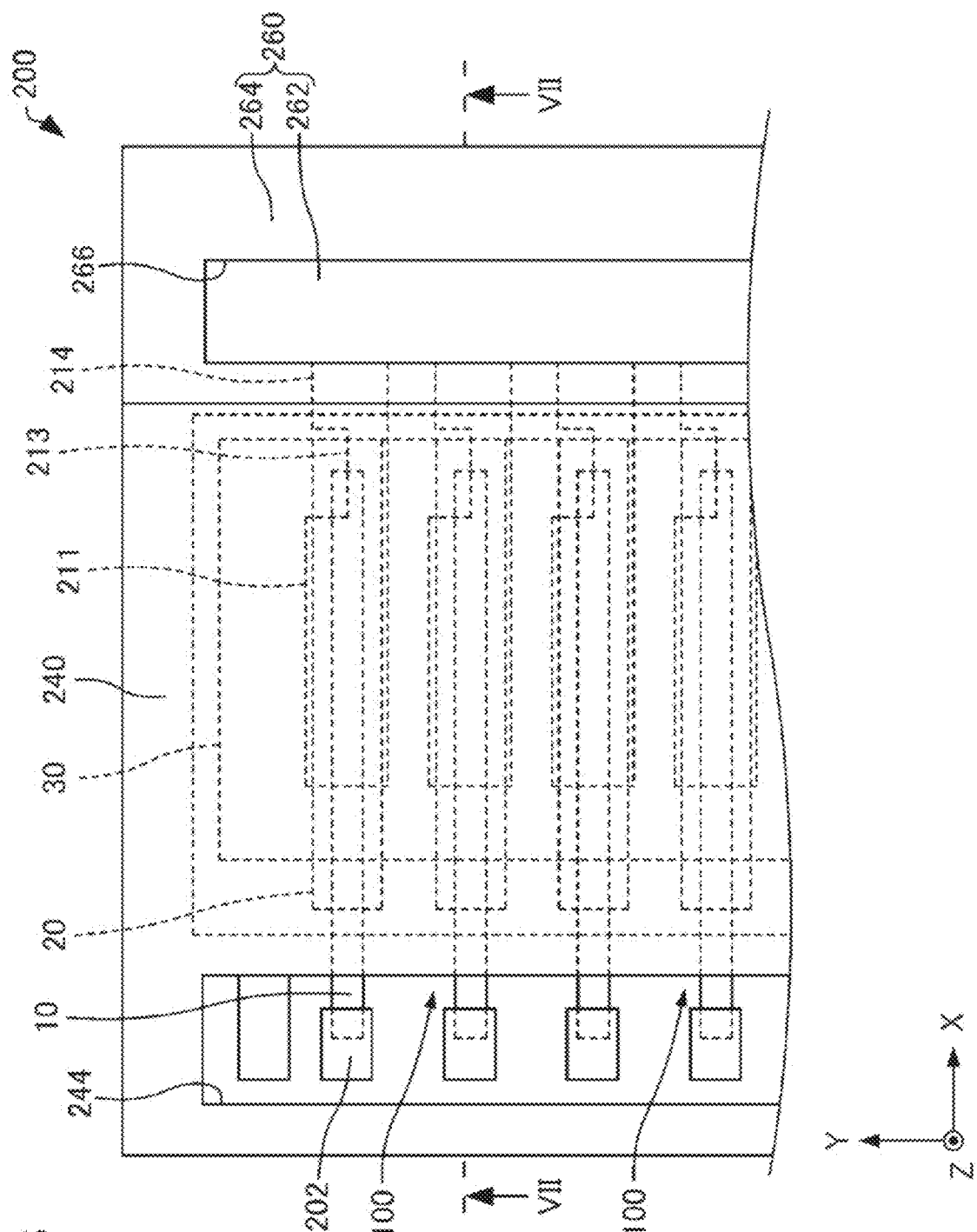
FIG. 6 is a schematic plan view of the liquid ejecting head according to the embodiment.

Next, a liquid ejecting head according to the present embodiment will be described with reference to drawings. FIG. 5 is a schematic exploded perspective view of a liquid ejecting head 200 according to the present embodiment. FIG. 6 is a schematic plan view of the liquid ejecting head 200 according to the present embodiment. FIG. is a schematic section view of the liquid ejecting head 200 according to the present embodiment taken along a line VII-VII of FIG. 6. To be noted, an X axis, a Y axis, and a Z axis are shown as three axes perpendicular to one another in FIGS. 5 to 7.

A liquid ejecting head according to the invention includes the piezoelectric element according to the invention. The liquid ejecting head 200 including the piezoelectric element 100 will be described below as an example.

Figure 7:
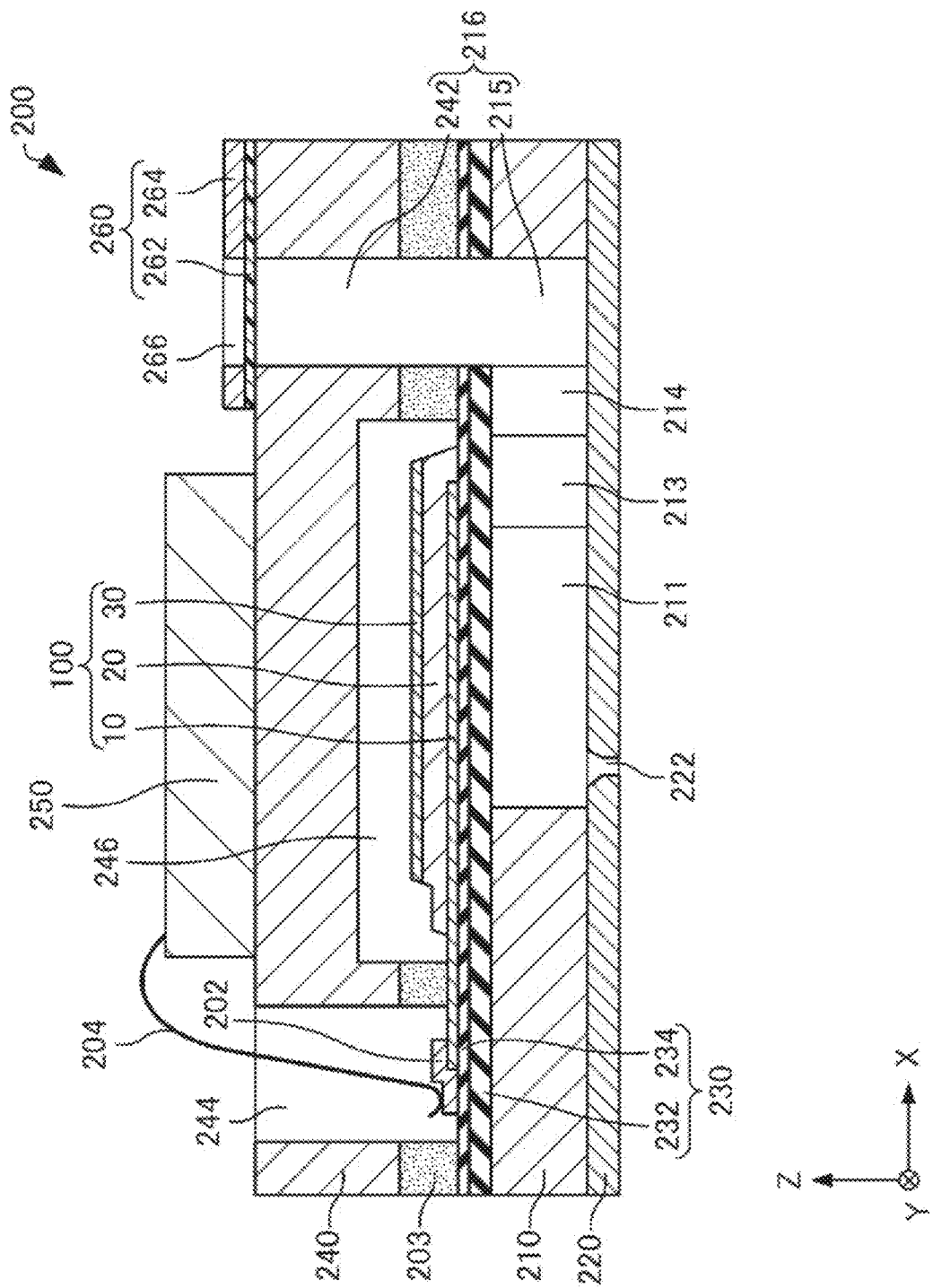
FIG. 7 is a schematic section view of the liquid ejecting head according to the embodiment.

As illustrated in FIGS. 5 to 7, the liquid ejecting head 200 includes, for example, the piezoelectric element 100, a channel-defining substrate 210, a nozzle plate 220, a diaphragm 230, a protective substrate 240, a circuit board 250, and a compliance substrate 260. To be noted, illustration of the circuit board 250 and connection wiring 204 is omitted in FIG. 5 for the sake of convenience.

The channel-defining substrate 210 is, for example, a silicon substrate. Pressure generating chambers 211 are provided in the channel-defining substrate 210. The pressure generating chambers 211 are partitioned by a plurality of partition walls 212.

In the channel-defining substrate 210, an ink supply path 213 and a communication path 214 are provided at an end portion of each of the pressure generating chambers 211 on the +X side. The ink supply path 213 is defined such that the opening area thereof shrinks when the end portion of the pressure generating chamber 211 on the +X side is squeezed in the Y axis direction. The size of the communication path 214 in the Y axis direction is, for example, the same as the size of the pressure generating chamber 211 in the Y axis direction. A communication portion 215 is provided on the +X side of the communication path 214. The communication portion 215 constitutes part of a manifold 216. The manifold 216 serves as a common ink chamber of the pressure generating chambers 211. As described above, liquid channels each including the pressure generating chamber 211, the ink supply path 213, the communication path 214, and the communication portion 215 are defined in the channel-defining substrate 210.

The nozzle plate 220 is provided on one surface (surface on the −Z side) of the channel-defining substrate 210. The material of the nozzle plate 220 is, for example, steel use stainless (SUS). The nozzle plate 220 is joined to the channel-defining substrate 210 by, for example, a glue or a heat sealing film. Nozzle openings 222 are arranged along the Y axis in the nozzle plate 220. The nozzle openings 222 communicate with the pressure generating chambers 211.

The diaphragm 230 is provided on the other surface (surface on the +Z side) of the channel-defining substrate 210. The diaphragm 230 is constituted by, for example, a first insulator layer 232 formed on the channel-defining substrate 210 and a second insulator layer 234 provided on the first insulator layer 232. The first insulator layer 232 is, for example, a silicon oxide layer. The second insulator layer 234 is, for example, a zirconium oxide layer.

The piezoelectric element 100 is provided on, for example, the diaphragm 230. The piezoelectric element 100 is provided in a plural number. The number of the piezoelectric elements 100 is not particularly limited.

In the liquid ejecting head 200, the diaphragm 230 and the first electrodes 10 are displaced by deformation of the piezoelectric layers 20 having an electromechanical conversion characteristic. That is, in the liquid ejecting head 200, the diaphragm 230 and the first electrodes 10 substantially has a function as a diaphragm. To be noted, the diaphragm 230 may be omitted and the first electrodes 10 may be configured to function as a diaphragm by themselves. In the case of providing the first electrodes 10 directly on the channel-defining substrate 210, it is preferable to protect the first electrodes 10 by an insulating protective film or the like such that ink does not directly contact the first electrodes 10.

The first electrodes 10 are each configured as an individual electrode independent for each of the pressure generating chamber 211. The size of the first electrode 10 in the Y axis direction is, for example, smaller than the size of the pressure generating chamber 211 in the Y axis direction. The size of the first electrode 10 in the X axis direction is, for example, smaller than the size of the pressure generating chamber 211 in the X axis direction. Both end portions of the first electrode 10 in the X axis direction are positioned further on the outside than both end portions of the pressure generating chamber 211. A leading electrode 202 is connected to the end portion of the first electrode 10 on the −X side.

The size of the piezoelectric layer 20 in the Y axis direction is, for example, larger than the size of the first electrode 10 in the Y axis direction. The size of the piezoelectric layer 20 in the X axis direction is, for example, larger than the size of the pressure generating chamber 211 in the X axis direction. The end portion of the piezoelectric layer 20 on the +X side is, for example, positioned further on the outside (on the +X side) than the end portion of the first electrode 10 on the +X side. That is, the end portion of the first electrode 10 on the +X side is covered by the piezoelectric layer 20. Meanwhile, the end portion of the piezoelectric layer 20 on the −X side is, for example, positioned further on the inside (on the +X side) than the end portion of the first electrode 10 on the −X side. That is, the end portion of the first electrode 10 on the −X side is not covered by the piezoelectric layer 20.

The second electrode 30 is continuously provided on the piezoelectric layers 20 and the diaphragm 230. The second electrode 30 is configured as a common electrode shared by a plurality of piezoelectric elements 100. To be noted, although not illustrated, the first electrode 10 instead of the second electrode 30 may be configured as a common electrode.

The protective substrate 240 is joined to the channel-defining substrate 210 by a glue 203. The protective substrate 240 is provided with a through hole 242. In the illustrated example, the through hole 242 penetrates through the protective substrate 240 in the Z axis direction and communicates with the communication portion 215. The through hole 242 and the communication portion 215 constitute the manifold 216 serving as a common ink chamber for the pressure generating chambers 211. Further, the protective substrate 240 is provided with a through hole 244 penetrating through the protective substrate 240 in the Z axis direction. End portions of the leading electrodes 202 are positioned at the through hole 244.

The protective substrate 240 is provided with an opening portion 246. The opening portion 246 is a space for not hindering driving of the piezoelectric elements 100. The opening portion 246 may be sealed or not sealed.

The circuit board 250 is provided on the protective substrate 240. The circuit board 250 includes a semiconductor integrated circuit (IC) for driving the piezoelectric elements 100. The circuit board 250 and the leading electrodes 202 are electrically interconnected via the connection wiring 204.

The compliance substrate 260 is provided on the protective substrate 240. The compliance substrate 260 includes a sealing layer 262 provided on the protective substrate 240 and a fixing board 264 provided on the sealing layer 262. The sealing layer 262 is a layer for sealing the manifold 216. For example, the sealing layer 262 is flexible. The fixing board 264 is provided with a through hole 266. The through hole 266 penetrates through the fixing board 264 in the Z axis direction. The through hole 266 is provided at such a position as to overlap the manifold 216 in plan view (as viewed in the Z axis direction).

The liquid ejecting head 200 includes the piezoelectric element 100 capable of suppressing the leak current. Therefore, in the liquid ejecting head 200, the diaphragm 230 can be efficiently displaced.

4. PRINTER

Figure 8:
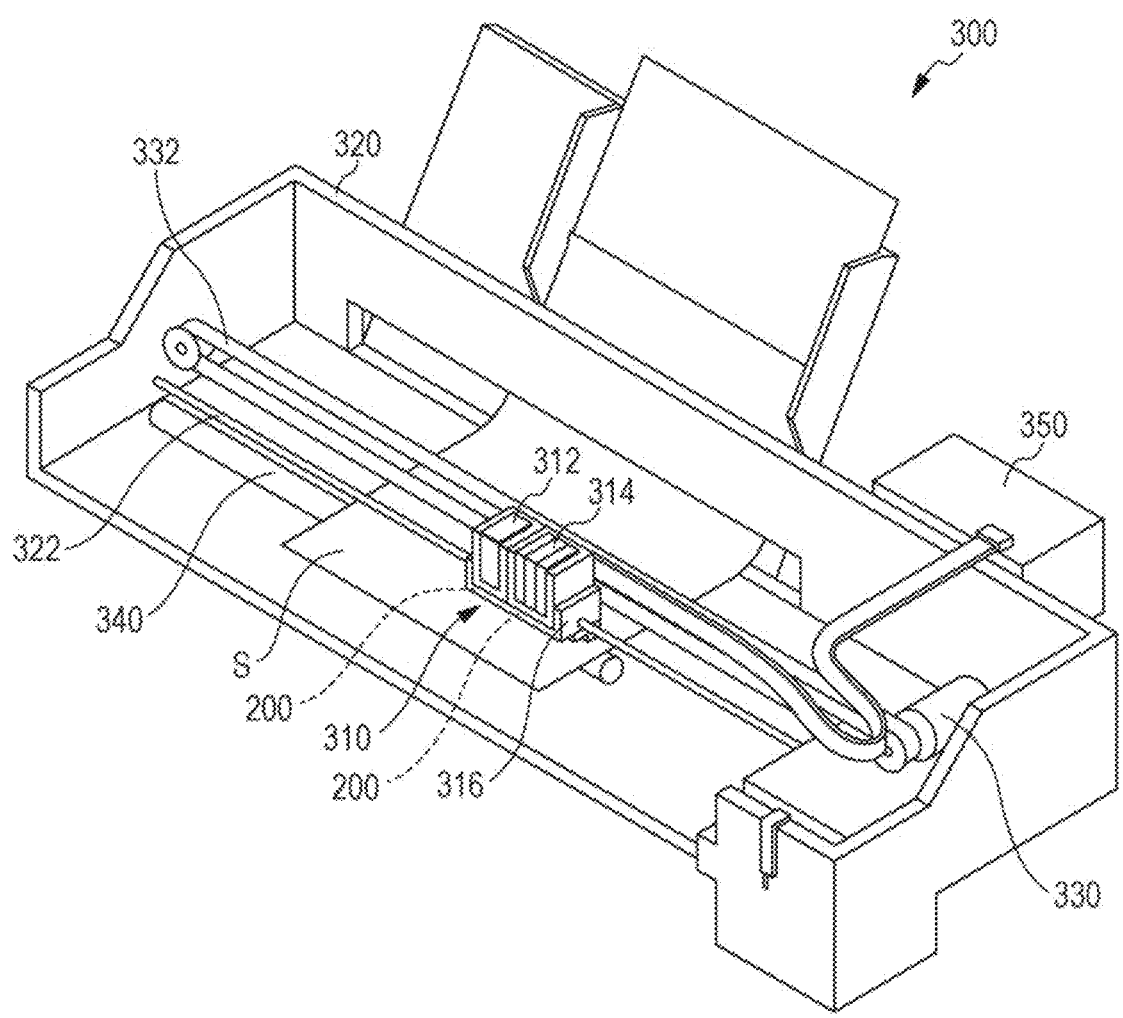
FIG. 8 is a schematic perspective view of a printer according to the embodiment.

Next, a printer according to the present embodiment will be described with reference to drawings. FIG. 8 is a schematic perspective view of a printer 300 according to the present embodiment.

A printer according to the invention includes the liquid ejecting head according to the invention. The printer 300 including the liquid ejecting head 200 will be described below as an example.

The printer 300 is an ink jet printer. As illustrated in FIG. 8, the printer 300 includes a head unit 310. The head unit 310 includes liquid ejecting heads 200. The number of the liquid ejecting heads 200 is not particularly limited. Cartridges 312 and 314 constituting an ink supply unit are attachably and detachably provided in the head unit 310. A carriage 316 mounting the head unit 310 is provided, on a carriage shaft 322 attached to an apparatus body 320, so as to be movable in the shaft direction, and for example, ejects a black ink composition and color ink compositions.

In the printer 300, the carriage 316 mounting the head unit 310 is moved along the carriage shaft 322 as a result of driving force of a driving motor 330 being transmitted to the carriage 316 via a plurality of unillustrated gears and a timing belt 332. Meanwhile, the apparatus body 320 is provided with a transport roller 340 serving as a transport unit, and a recording sheet S that is a recording medium of paper or the like is transported by the transport roller 340. The transport unit that transports the recording sheet S is not limited to a transport roller, and may be a belt, a drum, or the like.

The printer 300 includes a printer controller 350. The printer controller 350 is electrically connected to the circuit board 250 (see FIG. 7) of the liquid ejecting head 200. The printer controller 350 includes, for example, a control portion constituted by a random access memory (RAM) for temporarily storing various data, a read only memory (ROM) storing control programs and the like, a central processing unit (CPU), and the like, a drive signal generation circuit for generating a drive signal to be supplied to the liquid ejecting head 200, and so forth.

The printer 300 includes the liquid ejecting head 200 in which the diaphragm 230 can be efficiently displaced. Therefore, the printer 300 can eject an ink onto the recording sheet S with low power consumption.

5. EXPERIMENTAL EXAMPLES

The invention will be described more in detail with reference to the following experimental examples. To be noted, the invention should not be limited by the following experimental examples.

5.1. Preparation of Samples

5.1.1. Example 1

A substrate including a silicon substrate, a silicon oxide layer provided on the silicon substrate, and a zirconium oxide layer provided on the silicon oxide layer was formed. Next, a titanium oxide layer was formed on the substrate. Then, a first electrode (film thickness: 50 nm) constituted by platinum was formed on the titanium oxide layer by a sputtering method.

Next, a piezoelectric layer constituted by a KNN layer was formed on the first electrode by a sol-gel method. Specifically, the piezoelectric layer constituted by six precursor layers was formed by repetitively performing the series of steps from the application step to the firing step six times. The firing temperature in the firing step was set to 600° C. In addition, the film thickness of each precursor layer was set to 75 nm. Further, the precursor solution was prepared such that the molar ratio of K, Na, Nb, and Mn in the piezoelectric layer was K:Na:Nb:Mn 42.5:64.2:99.5:0.5.

Then, a second electrode (film thickness: 50 nm) constituted by platinum was formed on the piezoelectric layer by a sputtering method. In the sputtering method for forming the second electrode, the sputtering temperature (substrate temperature) was set to 250° C., the film formation rate was set to 0.24 nm/sec, the pressure in a chamber of the sputtering apparatus was set to 0.4 Pa, and power applied between a target and a sample was set to 150 W.

Next, the sample was subjected to a heating process. The heating process was performed by raising the temperature from 350° C. to 750° C. at a temperature raising rate of 4° C./sec by using the RTA apparatus and maintaining the temperature at 750° C. for 10 minutes.

A piezoelectric element of Example 1 was produced in this manner.

5.1.2. Comparative Example 1

In Comparative Example 1, a piezoelectric element was produced in the same manner as Example 1 except that the heating process by the RTA apparatus after forming the second electrode was not performed.

5.1.3. Comparative Example 2

In Comparative Example 2, a piezoelectric element was produced in the same manner as Example 1 except that the temperature of the heating process by the RTA apparatus after forming the second electrode was changed to 650° C.

5.2. STEM Observation

Crystal defect observation of atomic resolution by a scanning moiré fringe method was performed on piezoelectric elements of Example 1 and Comparative Examples 1 and 2 by using a scanning transmission electron microscope with spherical aberration correction of irradiation system: Cs correcter STEM (JEM-ARM200F manufactured by JEOL, accelerating voltage: 120 kV). To be noted, the samples were produced by using focused ion beam processing: FIB (Helios600i manufactured by Thermo Fisher), and a damage layer was removed in final processing with an accelerating voltage of 2 kV.

Here, crystal defect observation by the scanning moiré fringe method will be described in detail. Generation of moiré fringes require two lattices. The [100]pc crystal lattice plane of KNN was used for one of the two, and a lattice formed by scanning lines of the STEM apparatus was used for the other of the two. That is, parallel moiré fringes were formed by a combination the crystal lattice ($d_{lattice}$) of the sample and the lattice ($d_{raster}$) formed by the scanning lines. The parallel moiré fringes are generated in the case where the directions of the two lattices are the same and spacings thereof are slightly different. The results were obtained under an observation condition of $d_{lattice} > d_{raster}$ by adjusting the observation magnification. This means that the moiré fringes exhibit negative distortion (spacing of moiré fringes decreases) for positive distortion (lattice spacing increases).

Spacing of parallel moiré fringes generated when the scanning lines are disposed parallel to the c plane (plane parallel to the thickness direction: out-of-plane direction) of the KNN layer (piezoelectric layer) is defined as "dyy", and spacing of moiré fringes generated when the scanning lines are disposed parallel to the ab plane (in-plane direction) is defined as "dxx". In observation, the sample was disposed such that the lattice plane and the scanning lines are parallel, further, fine adjustment was performed by raster rotation of the scanning lines, and thus parallel moiré fringes were formed. This is a very practical method because, by using this effect, the field of view of defect observation can be widened (up to 10 times) as compared with a conventional method (lattice image method), and the distortion derived from lattice defects can be amplified.

Figure 9:
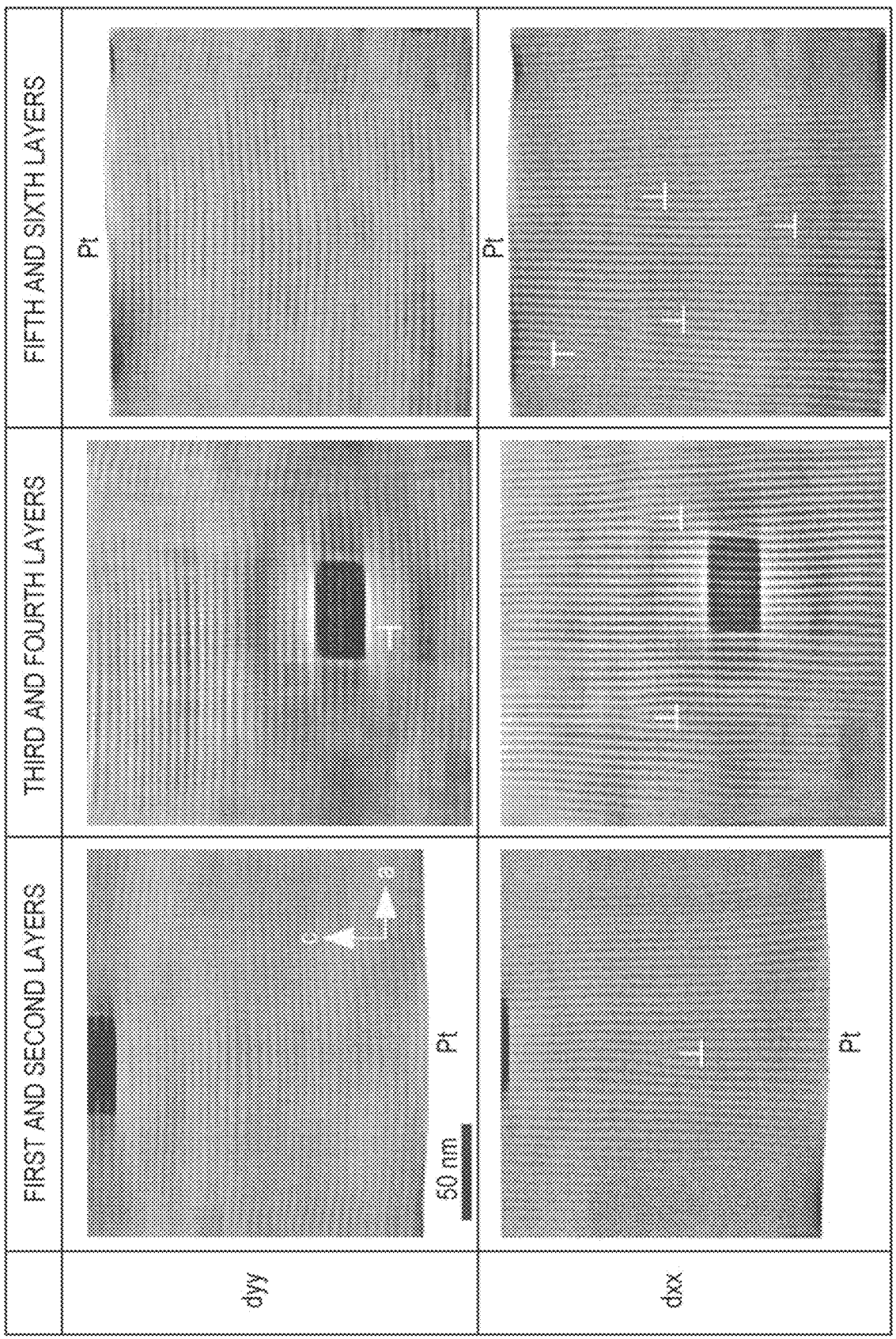
FIG. 9 shows a result of TEM observation of Example 1.
Figure 10:
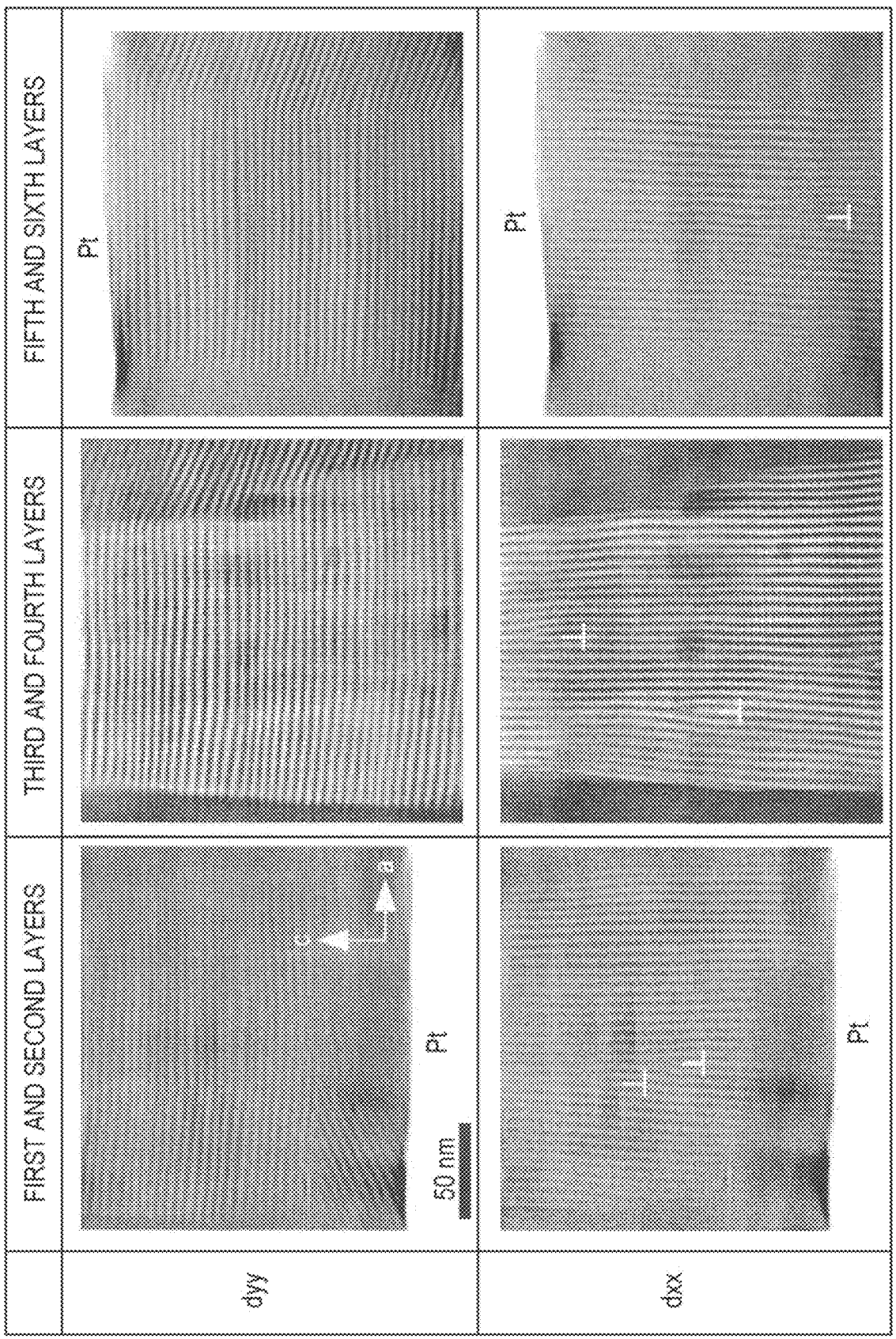
FIG. 10 shows a result of TEM observation of Comparative Example 1.
Figure 11:
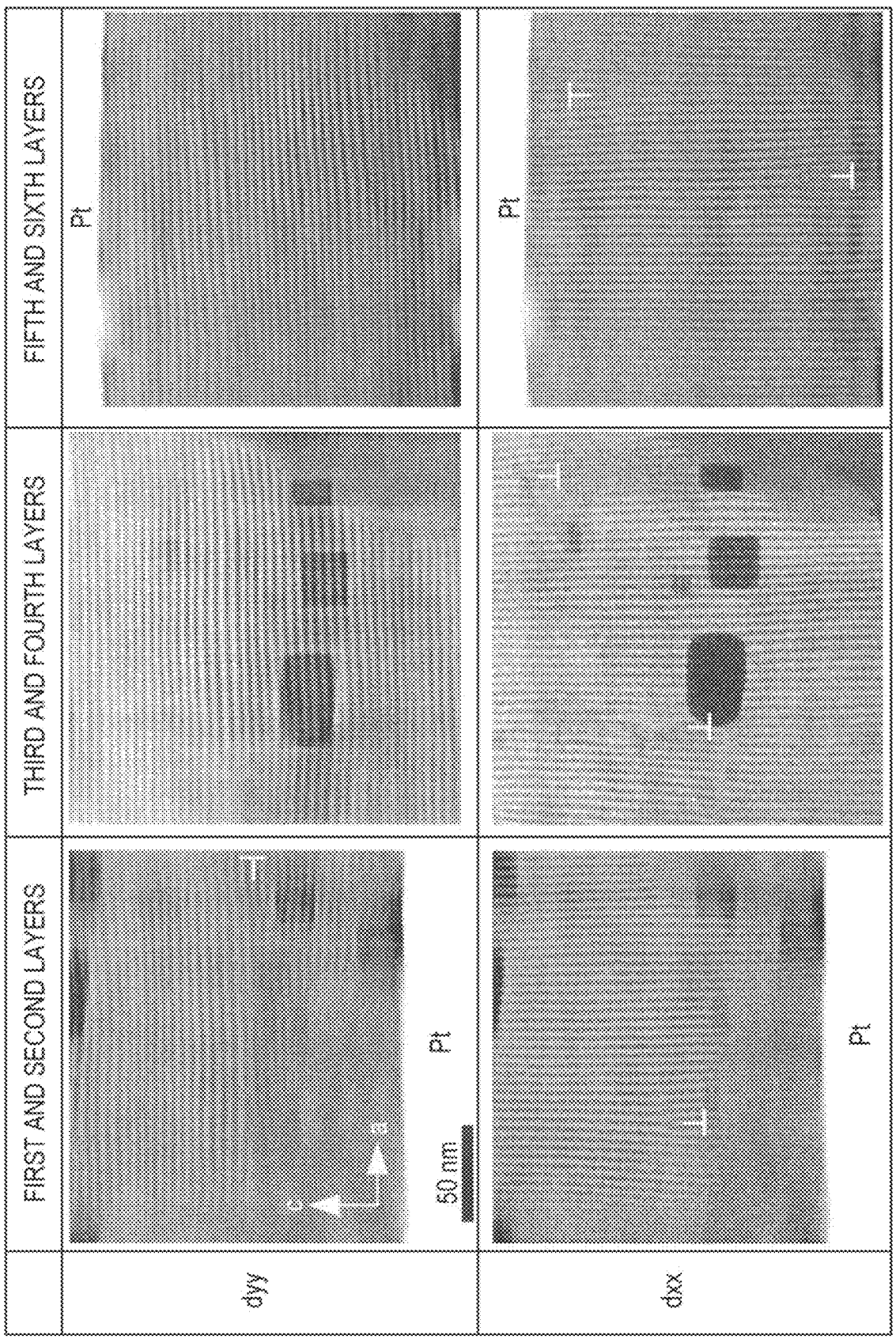
FIG. 11 shows a result of TEM observation of Comparative Example 2.

FIG. 9 shows a result of TEM observation of Example 1. FIG. 10 shows a result of TEM observation of Comparative Example 1. FIG. 11 shows a result of TEM observation of Comparative Example 2. The TEM images of FIGS. 9 to 11 are TEM images of 200 nm×200 nm, and the c axis direction corresponds to the thickness direction of the piezoelectric layer. In addition, in FIGS. 9 to 11, "First and Second Layers" are results of observation of the first and second layers of the precursor layers. Similarly, "Third and Fourth Layers" and "Fifth and Sixth Layers" are respectively results of observation of the third and fourth layers of the precursor layers and of the fifth and sixth layers of the precursor layers. In addition, in dxx of FIGS. 9 to 11, a positive edge dislocation is indicated by "⊥" (a sign in which a vertical line is disposed above a horizontal line), and a negative edge dislocation is indicated by a sign in which a vertical line is disposed below a horizontal line. In addition, in dyy of FIGS. 9 to 11, an edge dislocation is indicated by a sign in which a horizontal line is disposed on the left of a vertical line.

As illustrated in FIG. 9, in Example 1, four edge dislocations were observed in dxx of "Fifth and Sixth Layers" near the second electrode. This is because the part that had turned amorphous by taking in the second electrode atoms in the sputtering of the second electrode recrystallized in the heating process by the RTA apparatus, and the edge dislocations were generated by the stress derived from the difference between the lattice constant of the part of the piezoelectric layer 20 containing the second electrode atoms and the lattice constant of the part of the piezoelectric layer 20 not containing the second electrode atoms.

In contrast, as illustrated in FIG. 10, in Comparative Example 1, only one edge dislocation was observed in dxx of "Fifth and Sixth Layers". This is considered because the heating process by the RTA apparatus was not performed in Comparative Example 1, thus the part that had turned amorphous by taking in the second electrode atoms in the sputtering of the second electrode did not recrystallize, and the stress derived from the difference in the lattice constant was not generated. In addition, as illustrated in FIG. 11, in Comparative Example 2, only one edge dislocation was observed in dxx "Fifth and Sixth Layers". This is considered because, in Comparative Example 2, the temperature of the heating process by the RTA apparatus was low, thus the recrystallization was not sufficient, and the stress derived from the difference in the lattice constant was small. In Comparative Examples 1 and 2, no unevenness was observed in the distribution of the edge dislocations in the thickness direction of the piezoelectric layer.

As illustrated in FIGS. 9 to 11, in dxx of "First and Second Layers" and "Third and Fourth Layers", no big difference was recognized in the number of edge dislocations between Example 1 and Comparative Example 1. This is considered because the second electrode atoms do not get into the first to fourth layers of the precursor layers and thus the stress derived from the difference in the lattice constant is not generated.

Here, dxx shows the results of observation of the lattice periodicity in a direction perpendicular to the thickness direction of the piezoelectric layer. Therefore, it can be said that, in Example 1, the density of edge dislocations in "Fifth and Sixth Layers" is higher than the density of edge dislocations in "First and Second Layers" and "Third and Fourth Layers" in the case of observing the lattice periodicity in the direction perpendicular to the thickness direction of the piezoelectric layer. In addition, three out of the four edge dislocations in "Fifth and Sixth Layers" of dxx were positive edge dislocations.

In addition, as illustrated in FIGS. 9 to 11, in dyy, no big difference was recognized in the number of edge dislocations between Example 1 and Comparative Example 1. This is considered because, in the KNN layer, the stress derived from the difference between the lattice constant of the part of the piezoelectric layer 20 containing the second electrode atoms and the lattice constant of the part of the piezoelectric layer 20 not containing the second electrode atoms is more likely to act on the direction perpendicular to the thickness direction and is less likely to act on the thickness direction.

5.3. Measurement of Leak Current

Figure 12:
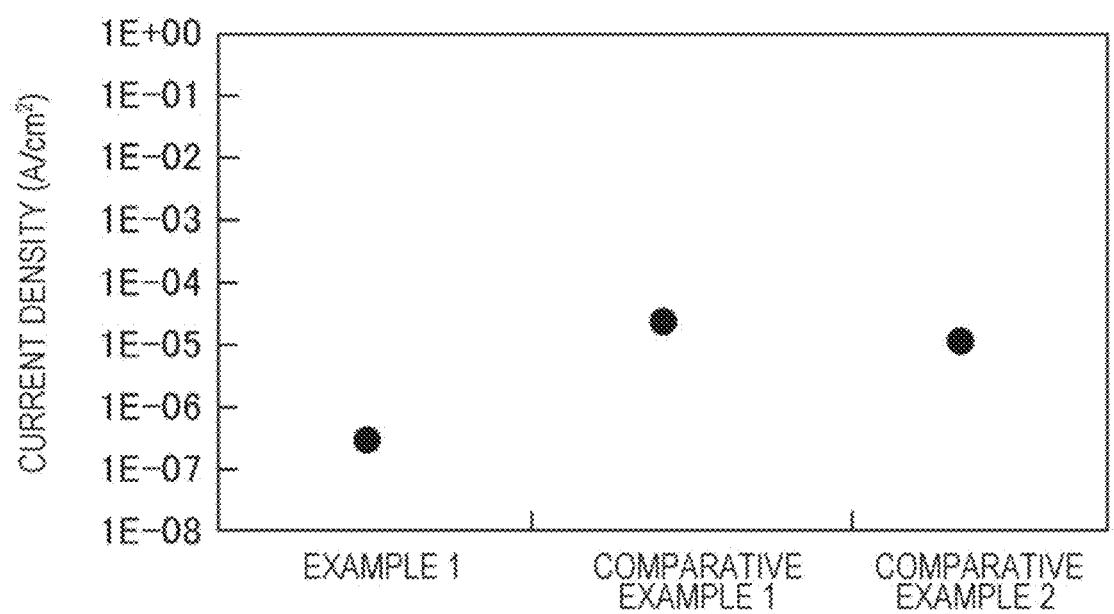
FIG. 12 is a graph showing results of measurement of leak current of Example 1 and Comparative Example 1.

Leak currents of piezoelectric elements of Example 1 and Comparative Examples 1 and 2 were measured by using a pA meter (4140B manufactured by Agilent Technologies). Specifically, the leak current when applying a voltage of 20 V between the first electrode and the second electrode by raising the voltage by 2 V per 2 seconds with a delay time of 2 seconds and a hold time of 2 seconds was measured. FIG. 12 is a graph showing measurement results of leak currents of Example 1 and Comparative Example 1, and the vertical axis thereof indicates current density.

As illustrated in FIG. 12, the current density of Example 1 was lower than the current density of Comparative Example 1. This is considered because, in Comparative Example 1, a part having turned amorphous, which was likely to conduct electrons and metal ions, existed in the piezoelectric layer, and thus the leak current increased. Specifically, the current density of Example 1 was $3\times10^{-7}$ (A/cm$^2$), the current density of Comparative Example 1 was $2.2\times10^{-5}$ (A/cm$^2$), and the current density of Comparative Example 2 was $1.1\times10^{-5}$ (A/cm$^2$).

As described above, according to the experimental examples, it was found that, in the case where the piezoelectric layer is divided into two portions at the center thereof in the thickness direction, the leak current can be suppressed when the density of line defects (edge defects observed in dxx) in the second portion on the second electrode side is higher than the density of line defects in the first portion on the first electrode side.

Elements of the invention can be partially omitted and the embodiments and modification examples may be combined as long as the features and effects described in the present disclosure are achieved.

The invention includes configurations that are substantially the same as the configuration described in the embodiment (for example, configurations having the same functions, using the same methods, and having the same results, or configurations having the same object and the same effect). In addition, the invention includes configurations in which a portion that is not significant in the configuration described in the embodiment is replaced. In addition, the invention includes configurations that have the same effect as the configuration described in the embodiment and configurations that achieve the same object. In addition, the invention includes configurations in which a known technique is added to the configuration described in the embodiment.

What is claimed is:

1. A piezoelectric element comprising:
   a first electrode provided above a substrate;
   a piezoelectric layer provided above the first electrode, containing potassium, sodium, and niobium, and having a perovskite structure; and
   a second electrode provided above the piezoelectric layer,
   wherein the piezoelectric layer is divided into two portions at a center thereof in a thickness direction, the piezoelectric layer includes a first portion on the first electrode side and a second portion on the second electrode side,
   wherein each of the first and second portions of the piezoelectric layer includes line defects, and
   wherein a density of the line defects in the second portion is higher than a density of the line defects in the first portion.

2. The piezoelectric element according to claim 1, wherein the line defects are observed in a case where lattice periodicity of the piezoelectric layer in a direction perpendicular to the thickness direction is observed.

3. A liquid ejecting head comprising the piezoelectric element according to claim 2.

4. The piezoelectric element according to claim 1, wherein the line defects are edge dislocations.

5. The piezoelectric element according to claim 4, wherein the line defects are positive edge dislocations.

6. A liquid ejecting head comprising the piezoelectric element according to claim 5.

7. A liquid ejecting head comprising the piezoelectric element according to claim 4.

8. A liquid ejecting head comprising the piezoelectric element according to claim 1.

9. The piezoelectric element according to claim 1, wherein a majority of the line defects in the second portion are located proximate the second electrode and distal from an interface between the first portion and the second portion.

* * * * *